(12) United States Patent
Sjursen et al.

(10) Patent No.: US 8,121,327 B2
(45) Date of Patent: Feb. 21, 2012

(54) HEARING AID

(75) Inventors: Walter P. Sjursen, Washington Crossing, PA (US); Michael DeSalvo, Princeton, NJ (US); Hassan Mohamed, Bayonne, NJ (US); Paul J. Mulhauser, New York, NY (US); Karl D. Kirk, III, New York, NY (US)

(73) Assignee: K/S HIMPP, Lynge (DK)

( * ) Notice: Subject to any disclaimer, the term of this patent is extended or adjusted under 35 U.S.C. 154(b) by 134 days.

(21) Appl. No.: 12/587,671

(22) Filed: Oct. 9, 2009

(65) Prior Publication Data

US 2010/0098280 A1    Apr. 22, 2010

Related U.S. Application Data

(62) Division of application No. 11/343,969, filed on Jan. 30, 2006, now Pat. No. 7,756,284.

(51) Int. Cl.
*H04R 25/00* (2006.01)

(52) U.S. Cl. .................. 381/323; 381/322; 381/328

(58) Field of Classification Search ............... 381/23.1, 381/312–331, 333–336, 370–384; 379/430; 181/129–131

See application file for complete search history.

(56) References Cited

U.S. PATENT DOCUMENTS

| | | | |
|---|---|---|---|
| 3,876,843 A | 4/1975 | Moen | |
| 4,081,782 A | 3/1978 | Hildreth et al. | |
| 4,117,444 A | 9/1978 | Hildreth et al. | |
| 4,451,709 A * | 5/1984 | Waxman | 381/327 |
| 4,467,145 A | 8/1984 | Borstel | |
| 4,550,227 A | 10/1985 | Topholm | |
| 4,736,430 A | 4/1988 | Schroder | |
| D297,979 S | 10/1988 | Voroba et al. | |
| 4,803,458 A | 2/1989 | Trine et al. | |
| 4,922,540 A | 5/1990 | Erbe | |
| 5,204,917 A * | 4/1993 | Arndt et al. | 381/324 |
| 5,341,433 A | 8/1994 | Meyer et al. | |
| 5,404,407 A | 4/1995 | Weiss | |
| 5,463,692 A | 10/1995 | Fackler | |
| 5,588,064 A | 12/1996 | McSwiggen et al. | |
| 5,687,242 A | 11/1997 | Iburg | |
| 5,751,820 A | 5/1998 | Taenzer | |
| 5,757,933 A | 5/1998 | Preves et al. | |
| D397,796 S | 9/1998 | Yabe et al. | |
| 5,825,896 A | 10/1998 | Leedom | |
| 5,881,159 A | 3/1999 | Aceti et al. | |
| D412,987 S | 8/1999 | Borowsky et al. | |
| 6,058,198 A | 5/2000 | Aceti et al. | |
| 6,069,963 A | 5/2000 | Martin et al. | |

(Continued)

FOREIGN PATENT DOCUMENTS

WO    WO 03/047307 A2    6/2003

(Continued)

*Primary Examiner* — Suhan Ni
(74) *Attorney, Agent, or Firm* — Hamilton, Brook, Smith & Reynolds, P.C.

(57) ABSTRACT

A hearing aid includes a circuit board having a battery affixed thereon and a switch that utilizes a portion of the circuit board as a portion of the switch. The battery is permanently affixed to the circuit board in at least one location and at least a portion of the battery is spaced away from the circuit board. The circuit board further includes at least one pair of printed switch traces. The switch is integrated into the circuit board in a way that utilizes the circuit board to form a rotary switch.

15 Claims, 14 Drawing Sheets

U.S. PATENT DOCUMENTS

| | | | |
|---|---|---|---|
| 6,104,822 A | 8/2000 | Melanson et al. | |
| D431,294 S | 9/2000 | Barnard et al. | |
| 6,120,328 A * | 9/2000 | Bricaud et al. | 439/630 |
| 6,205,227 B1 | 3/2001 | Mahoney et al. | |
| 6,292,571 B1 | 9/2001 | Sjursen | |
| 6,366,678 B1 | 4/2002 | Madaffari et al. | |
| 6,389,143 B1 | 5/2002 | Leedom et al. | |
| 6,410,997 B1 | 6/2002 | Sjursen et al. | |
| 6,473,511 B1 | 10/2002 | Aceti et al. | |
| 6,473,513 B1 | 10/2002 | Shennib et al. | |
| D468,301 S | 1/2003 | Fushimi | |
| 6,567,525 B1 | 5/2003 | Sapiejewski | |
| 6,567,527 B1 | 5/2003 | Baker et al. | |
| 6,630,639 B2 | 10/2003 | McSwiggen | |
| 6,694,034 B2 | 2/2004 | Julstrom et al. | |
| 6,724,902 B1 | 4/2004 | Shennib et al. | |
| 6,731,768 B1 | 5/2004 | Delage | |
| 6,766,031 B1 | 7/2004 | Westermann | |
| 6,865,279 B2 | 3/2005 | Leedom | |
| 6,914,994 B1 | 7/2005 | Shennib et al. | |
| 6,927,632 B2 | 8/2005 | Sjursen et al. | |
| 6,940,988 B1 | 9/2005 | Shennib et al. | |
| 6,940,989 B1 | 9/2005 | Shennib et al. | |
| 7,003,127 B1 | 2/2006 | Sjursen et al. | |
| 7,010,137 B1 | 3/2006 | Leedom et al. | |
| 7,030,326 B2 * | 4/2006 | Wilsser | 200/16 A |
| 7,082,206 B2 | 7/2006 | Mahoney et al. | |
| 7,092,543 B1 | 8/2006 | Mahoney et al. | |
| 7,113,611 B2 | 9/2006 | Leedom et al. | |
| 7,221,768 B2 | 5/2007 | Sjursen et al. | |
| D554,756 S | 11/2007 | Sjursen et al. | |
| 7,298,857 B2 | 11/2007 | Shennib et al. | |
| 7,313,245 B1 | 12/2007 | Shennib et al. | |
| 7,372,973 B2 | 5/2008 | Meier | |
| 7,403,629 B1 | 7/2008 | Aceti et al. | |
| 7,424,124 B2 | 9/2008 | Shennib et al. | |
| 7,433,482 B2 | 10/2008 | Wehner | |
| 2002/0085728 A1 | 7/2002 | Shennib et al. | |
| 2004/0081328 A1 | 4/2004 | Leedom et al. | |
| 2004/0240695 A1 | 12/2004 | Leedom et al. | |
| 2005/0053251 A1 | 3/2005 | King | |
| 2005/0190938 A1 | 9/2005 | Shennib et al. | |
| 2005/0259840 A1 | 11/2005 | Gable et al. | |
| 2006/0002574 A1 | 1/2006 | Shennib et al. | |
| 2006/0050914 A1 | 3/2006 | Urso et al. | |
| 2006/0215862 A1 | 9/2006 | Huynh et al. | |
| 2006/0291682 A1 | 12/2006 | Urso et al. | |
| 2006/0291683 A1 | 12/2006 | Urso et al. | |
| 2007/0003081 A1 | 1/2007 | Ram et al. | |
| 2007/0003084 A1 | 1/2007 | Huynh et al. | |
| 2007/0003087 A1 | 1/2007 | Ram et al. | |
| 2007/0009128 A1 | 1/2007 | Mahoney et al. | |
| 2007/0036379 A1 | 2/2007 | Anderson et al. | |
| 2007/0071265 A1 | 3/2007 | Leedom et al. | |
| 2007/0121967 A1 | 5/2007 | Sjursen et al. | |
| 2007/0154042 A1 | 7/2007 | Buckley et al. | |
| 2007/0177749 A1 | 8/2007 | Sjursen et al. | |
| 2007/0189563 A1 | 8/2007 | Sjursen et al. | |

FOREIGN PATENT DOCUMENTS

| | | |
|---|---|---|
| WO | WO 03/096745 A1 | 11/2003 |
| WO | WO 2005/006715 A2 | 1/2005 |

* cited by examiner

HEARING AID

RELATED APPLICATIONS

This application is a divisional of U.S. application Ser. No. 11/343,969, filed Jan. 30, 2006 now U.S. Pat. No. 7,756,284, which is related to co-pending U.S. Utility application Ser. No. 11/343,906, filed Jan. 30, 2006 entitled "Hearing Aid With Tuned Microphone Cavity," and co-pending U.S. Design patent application Ser. No. 29/253,043, filed Jan. 30, 2006 entitled "Hearing Aid." The entire teachings of the above applications are incorporated herein by reference.

BACKGROUND OF THE INVENTION

A hearing aid, in general, comprises a housing or ear mold which contains a receiver, a microphone, electronic circuitry connecting the receiver and the microphone, and a battery for operating the electronic circuitry. The housing is an ear mold which fits into the ear canal of the user.

There has been a growing need for small, reliable, easy to use low-cost hearing aids. In particular, it would be desirable to be able to provide a hearing aid design that could meet the needs of the vast majority of users experiencing age related hearing loss. Individuals with age related hearing loss is the fastest growing segment of the hearing compromised population. Still further, this aging population typically also experiences some loss in fine motor skill and vision. This further accentuates the need for hearing aids that have simple to use controls. A small and low cost hearing aid that is easy to use, comfortable, and meets the hearing needs of the vast majority of this growing segment of the population could support mass production techniques that would further reduce product cost; another desirable characteristic for older people who often have a limited income.

One problem facing hearing aid manufacturers is that the shape of various ear canals are very complex. The cross-section of the smallest area in the ear varies from a flat ellipse to a circle with a large number of sizes of each shape. This is further complicated by the fact that the ear canal bends up to 90 degrees in many ears. Standard hearing aids are custom fitted to each individual and constructed from a hard plastic which should fit the ear canal exactly. This custom fitting is an expensive and time-consuming process, which greatly increases the cost of the hearing aid, and because it is hard and durable it is generally uncomfortable.

Many attempts have been made in the art to provide small and easy to use hearing aid components and hearing aids. Still other prior art attempts have focused on reducing the cost of hearing aids and to broaden their appeal among the target population.

However, these attempts and others in the art suffer from several drawbacks. As illustrated by the plethora of attempts to improve ease of use and product cost, the prior art attempts do not provide hearing aids that are easy to use or low cost. Thus hearing aids of the art do not appeal to a large portion of potential users due to complexity and cost causing potential users to continue to suffer with uncorrected hearing loss or to use inferior partially out-of-the-ear product that are uncomfortable and unsightly.

Further, while hearing aids of the art have focused attention on miniaturization with ease of manufacture, neither of these objects have yet been satisfied in the art. To fit the large variety of ear canal geometries, hearing aids need to be even smaller.

What is needed in the art, therefore, is a hearing aid that is small yet lower in cost. One potential solution is to combine functions such as a battery door that also functions as a switch. While this may be efficient from a space/size perspective, it adds user and manufacturing complexity.

Thus, what is needed in the art is a hearing aid that is small and easy to operate, even with impaired dexterity and vision, while being lower in cost and manufacturing complexity.

SUMMARY OF THE INVENTION

The present invention provides a hearing aid having a circuit board containing a battery permanently affixed thereon wherein at least a portion of the battery is spaced away from the circuit board, and in one embodiment, a vented cavity is formed between the battery and the circuit board. The current invention further provides at least one switch trace on another portion of the circuit board, and in one embodiment, a set of switch traces are integrated into a compact rotary switch that can be easily operated with a sliding motion of one finger.

A hearing aid includes a circuit board having a battery affixed thereon and a switch that utilizes a portion of the circuit board as a portion of the switch. The battery is permanently affixed to the circuit board in at least one location and at least a portion of the battery is spaced away from the circuit board. The circuit board further includes at least one switch trace thereon. The switch is integrated into the circuit board in a way that utilizes the circuit board to form a rotary switch.

According to one aspect of the invention, the space between the battery and the circuit board forms a cavity. The cavity has a volume and a spacing from the battery cathode. The battery may be a metal-air type battery. The cavity may have a vent through the circuit board and the cavity may be otherwise sealed. The vent may have precise geometry. A laser may be used to form the vent.

According to another aspect of the invention, the battery is attached to the circuit board by solder or by a conductive adhesive. The conductive adhesive may be an epoxy adhesive. The circuit board may be a flexible circuit board (also known as a "flex circuit"). The battery anode may further be attached to the flex circuit. At least a portion of the metal-air battery cathode surface may be concave in shape and have at least one vent hole contained within the concave area. The circuit board can be attached to the surface of the battery having the concave area so as to provide spacing between the circuit board and the concave area of the battery, and to define a cavity between the battery and the circuit board.

According to yet another aspect of the invention, the switch traces on the circuit board are in the form of arcs. The arcs are concentric. The arcs are contacted by a set of rotating electrical contacts. At some positions of the rotation, the contacts close the circuit between two switch traces. In other positions, the contacts do not close the circuit between traces and thus the circuit is open. The circuit board with switch traces and the rotating electrical contacts are used to form a compact rotary switch.

In yet another aspect of the invention, the circuit board containing the switch traces also contains at least one vent. The vent is formed in the circuit board during manufacture of the circuit board. A laser may be used to form the vent.

In yet another aspect of the invention, the switch traces may have portions of higher electrical resistance and portions of lower resistance.

In yet another aspect of the invention, a user-operable rotary switch is formed by having a tab extending out of the plane of rotation of the electrical contacts. The user may move the tab over an arc causing different electrical responses at different positions within the arc. The arc may be limited and may be perceived by the user as linear rather than rotary movements.

In yet another aspect of the invention, there may be more than one set of switch traces and there may be more than one rotating electrical contact. The switch may have a means for maintaining a user-selected position. A spring may be used to keep the switch in a position. A friction means may be used to keep the switch in a position. The operation of the switch may further block the vent to the cavity between the circuit board and the battery when the switch is in an open circuit position thereby limiting the cavity and the battery to just the air they contain until the switch is reopened.

In another aspect, a hearing aid comprises a flexible circuit board containing a battery permanently affixed thereto, the battery having a first surface that is opposed to, and spaced away from, a surface of the flexible circuit board. The first surface of the battery can comprise at least one air intake hole. The battery can be permanently affixed by solder, an adhesive, or welding. The battery can be permanently affixed battery to the flexible circuit board at the battery cathode. In certain embodiments, the battery and the flexible circuit board can form a substantially enclosed chamber therebetween, and the chamber can includes a reactant, such as oxygen, for reaction within the battery. The chamber can also include a vent to permit the reactant to enter the chamber, and the vent can be provided through the circuit board. The hearing aid can also comprise a spacer between the surface of the battery and the surface of the flexible circuit board, and the spacer can include an opening extending through the spacer, such that the surface of the battery, the opposing surface of the circuit board and the spacer form define the substantially enclosed chamber. The chamber vent can be provided through the spacer.

In another embodiment, a hearing aid comprises a circuit board containing a battery permanently affixed thereto, the circuit board and the battery forming a substantially enclosed chamber.

In yet another embodiment, a hearing aid comprises a circuit board for a hearing aid comprising one or one switch traces. The switch trace or switch traces can engage with at least one rotating electrical contact to form a rotary switch. The rotary switch can include a raised tab for user operation, the raised tab extending from the plane of switch rotation. The raised tab can extend through a slot in the hearing aid face plate. In yet another embodiment, a flexible circuit board comprises at least one switch trace.

In yet another embodiment, a method of operating a hearing aid having a circuit and at least one switch trace comprises moving at least one rotating electrical contact relative to the at least one switch trace to modify the operation of the hearing aid, such as turning the hearing aid on and off, adjusting the volume of the hearing aid receiver, or both.

In yet another embodiment, a hearing aid comprises a hearing aid shell; a microphone enclosed within the hearing aid shell; and a sealing member, such as a gasket or o-ring, surrounding the periphery of the microphone, and substantially completely filling the area between the periphery of the microphone and the interior surface of the hearing aid shell. The microphone and sealing member can divide the interior volume of the hearing aid shell into outer and interior volumes, and substantially acoustically seal sound waves in the outer volume of the hearing aid shell from entering the interior volume of the shell. The hearing aid can further comprise a vent to vent air from the outer volume of the hearing aid shell to the interior volume of the shell, such that the vent can provide air to an air-activated battery located in the interior volume of the shell. The vent can comprise a slot in the hearing aid shell, or an air passageway through the sealing member. The vent can be configured to substantially prevent sound waves in the audible frequency range from entering the interior volume of the hearing aid shell.

In other aspects, the present invention relates to methods of manufacturing hearing aids as described above.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Figure 1:
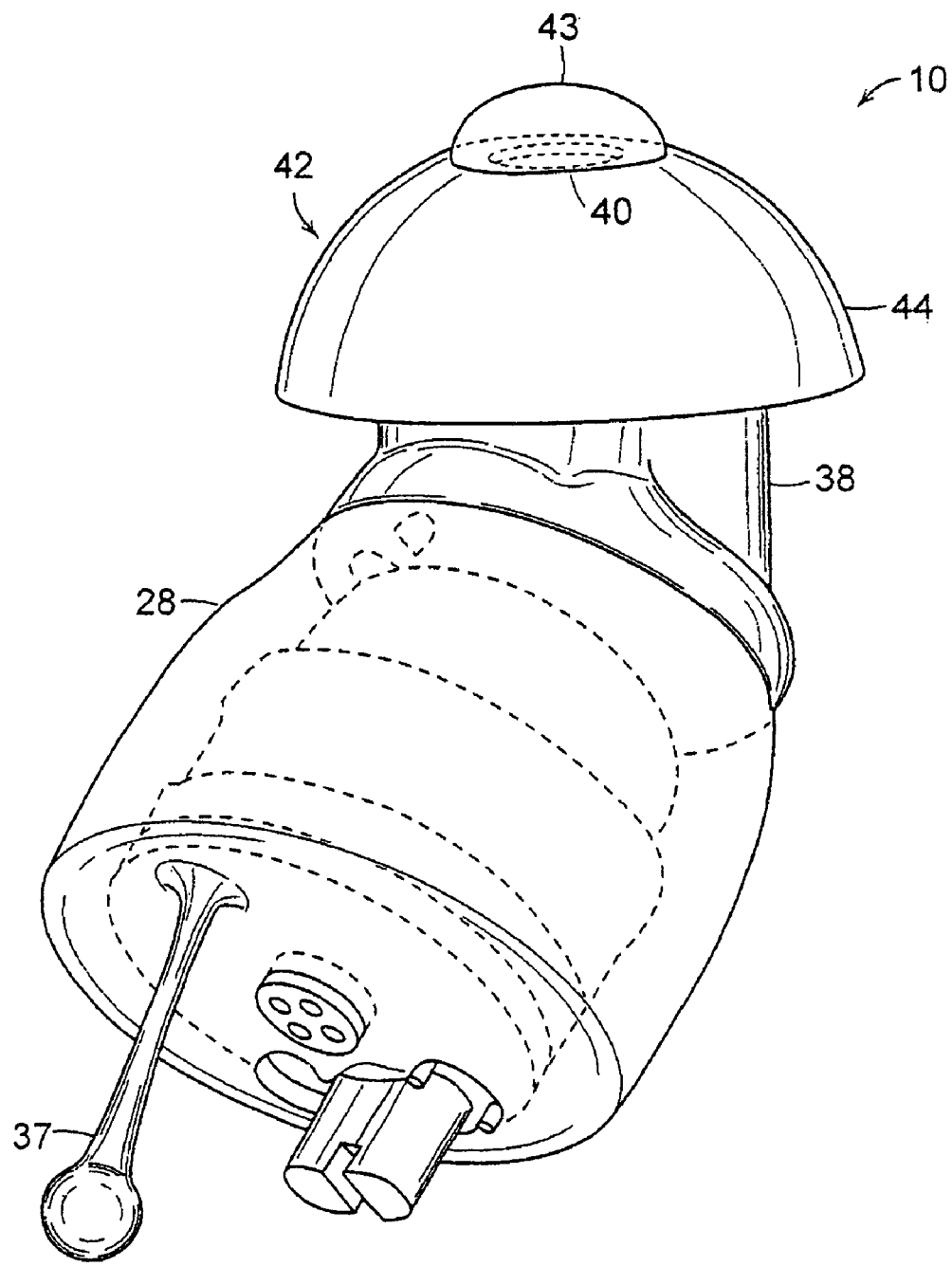
FIG. 1 illustrates a hearing aid.

A hearing aid is shown in FIG. 1 and is given generally as 10. The hearing aid includes a hearing aid shell 28, that is generally made from a durable, rigid or semi-rigid material, such as a molded plastic, and a hearing aid tip 42 that is preferably comprised of a flexible, compliant material to facilitate deep, comfortable fitting of the device in the ear canal of a user. The tip 42 can include a mushroom shaped portion 44 and a body portion 38. As shown in FIG. 1, the body portion 38 connects to the hearing aid shell 28, and functions as a stem-like support for the mushroom shaped portion 44, which extends radially out from the distal end of the tip 42, so as to form an acoustical seal when the device is inserted in the user's ear canal. A sound port 40 extends through tip 42 in order to convey amplified sound from the hearing aid into the user's ear. The tip 42 can be formed of a rubber material, such as silicone rubber. The tip 42 can also be cast in a mold using various durometer rubbers. A wax guard 43 can be attached to the tip 42 over the sound port 40 to trap and capture cerumen, and prevent the ceumen from entering the sound port and clogging the receiver.

Figure 2:
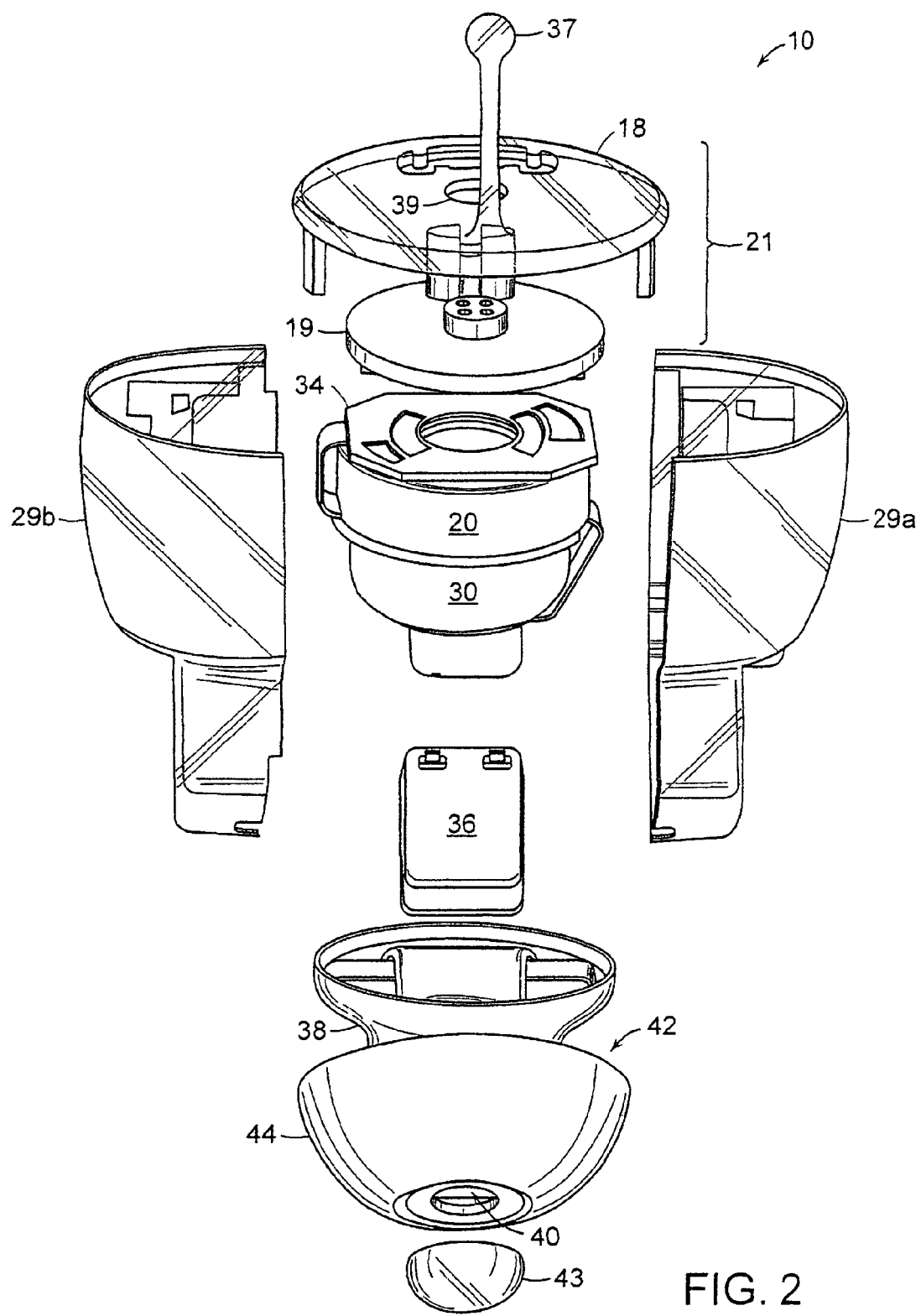
FIG. 2 shows an exploded front view of the hearing aid of FIG. 1.
Figure 3:
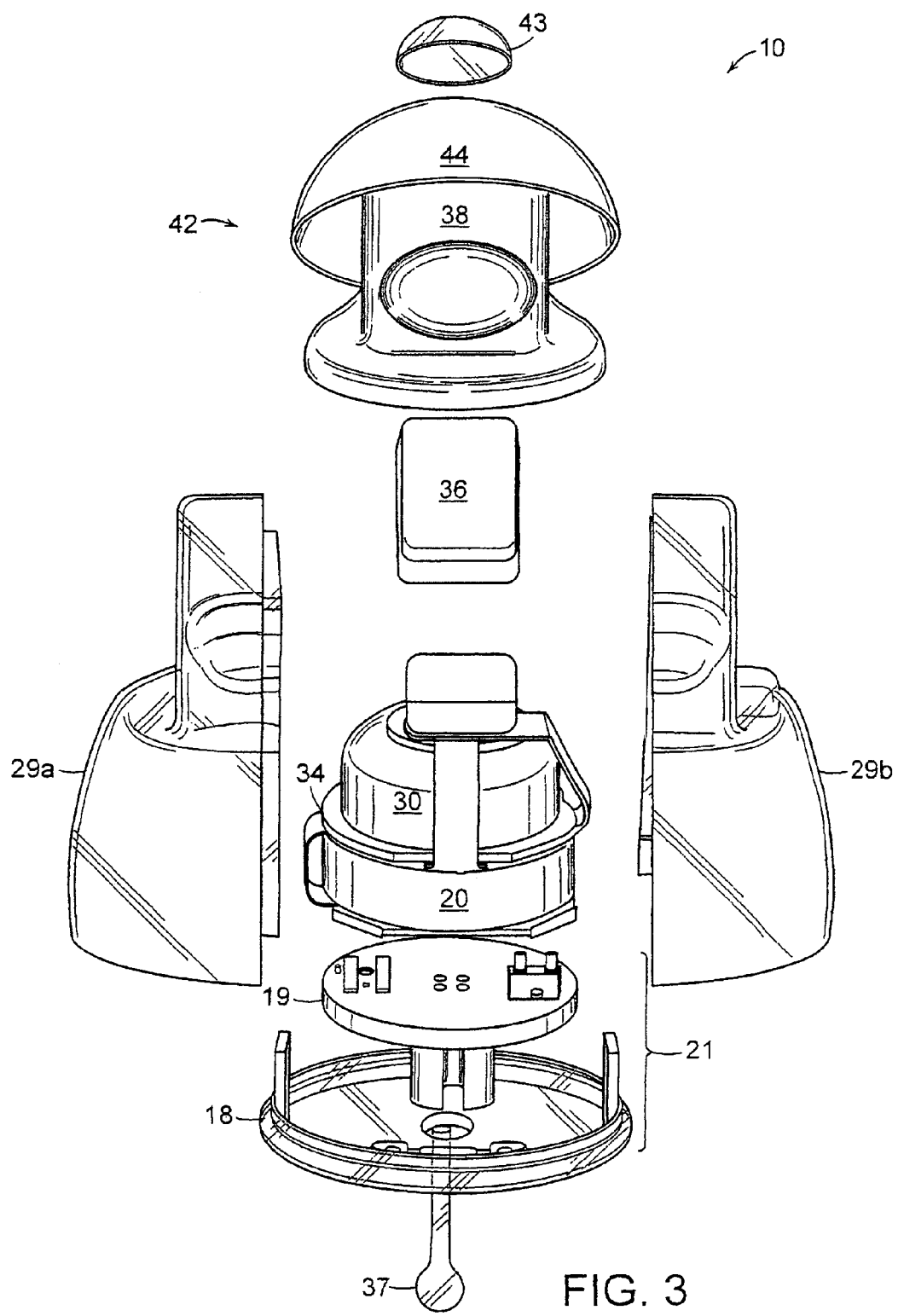
FIG. 3 shows an exploded rear view of the hearing aid of FIG. 1.

The various components of the hearing aid 10 are more clearly illustrated in the exploded views of the device in FIGS. 2 and 3. As is shown in these figures, the hearing aid shell 28 is comprised of a pair of half-shells, 29a and 29b, which are joined together to form a housing for a microphone 20, battery 30, flex circuit 34 and receiver 36. The shell 28 is made to generally conform to the contours of the ear canal of a typical user. However, the shell 28 does not need to be custom designed to fit the ear of a specific user (like the ear molds of conventional hearing devices), but is instead designed to comfortably fit in the ear of a relatively large percentage of the general population. Preferably, the present invention is a one-size-fits-all, or at least a one-size-fits-most device. It can also be a uni-ear device, meaning that the device can be worn in either the right ear or the left ear. The flexible tip 42 attaches to the distal end of the shell 28, proximate to the receiver 36. A face plate 18 attaches to the two half-shells at the proximal end of the device to complete the hearing aid enclosure. The face plate 18 preferably includes a pull-tab 37 to facilitate insertion and removal of the device from the user's ear. The face plate 18 in this embodiment also includes one or more openings 39 to permit air and sounds to enter the hearing aid shell. Located behind the face plate 18, and partially protruding from the face plate is a rotary switch 19. Together, the face plate 18 and rotary switch 19 function as a switching mechanism 21 for the hearing aid, the details of which will be described below.

Figure 4:
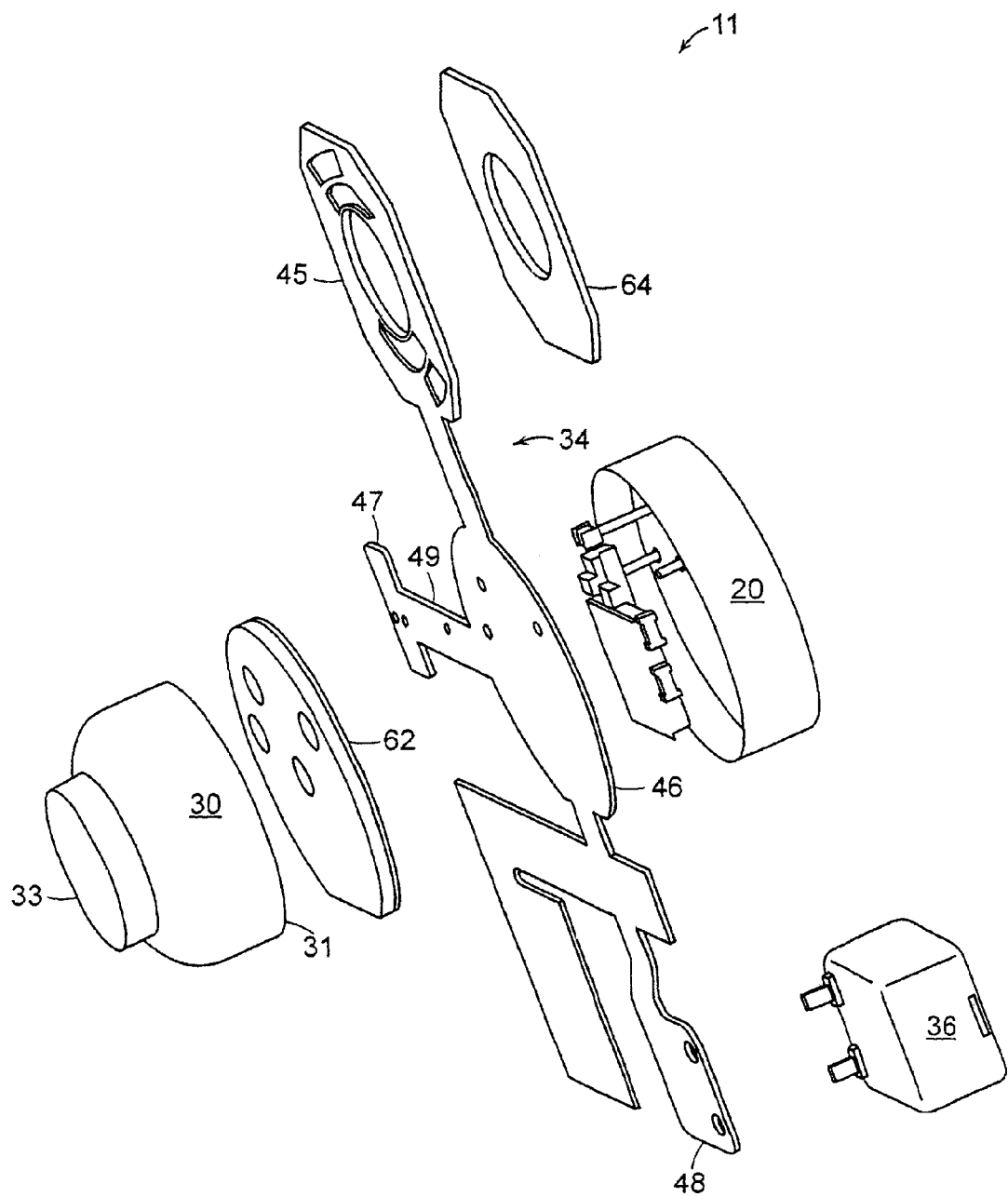
FIG. 4 shows an exploded view of a hearing aid electronics assembly.

As shown in FIGS. 2 and 3, the interior of the hearing aid 10 comprises a microphone 20, a battery 30, a circuit board 34, and a receiver 36, as well as associated circuitry and electrical connections. In a preferred embodiment, the circuitry and electrical connections are located on a flex circuit 34, that wraps around the various components of the hearing aid to act as the internal wiring and electrical contacts for the hearing aid, and can also contain the signal processing circuitry for the hearing aid. An embodiment of a flex circuit 34 and associated hearing aid components is shown in exploded view in FIG. 4. As shown in FIG. 4, the flex circuit 34 comprises several different portions: a switch trace portion 45, a microphone mating portion 46, a receiver mating portion 48, and battery contacts 47, 49.

Although the hearing aid in this embodiment includes a single flex circuit that contains the hearing aid circuitry and all of the electrical connections between the various components of the device, it will be understood that alternative designs are also possible. For example, the flex circuit 34 shown in this embodiment could be substituted, in whole or in part, by other types of circuitry, such as a non-flexible circuit board, and various other types of electrical connections, such as soldering and wire-connections, could be used.

An advantage of the present hearing aid using a flex circuit 34 is that substantially all of the hearing aid circuitry and electrical connections can be integrated onto a single component, and the various interior components of the hearing aid, such as the microphone 20, battery 30, and receiver 36, can be easily attached to the flex circuit 34 to produce a fully functional hearing aid electronics module 11. The module 11 can then be inserted into the hearing aid shell 28 and the tip 42 applied to provide a finished hearing aid. The hearing aid is thus extremely easy to manufacture on a large scale. This is illustrated in FIGS. 4-6, which shows the sequence of steps for the production of a fully functional hearing aid module 11.

As shown in FIG. 4, the microphone 20 is aligned over the microphone mating portion 46, and the receiver 36 is aligned over the receiver mating portion 48. The battery 30 is generally mounted underneath the microphone mating portion 46 of the flex circuit 34, opposite the microphone 20. In a preferred embodiment, the cathode 31 of the battery 30 is mounted adjacent to and parallel with the microphone mating portion 46 of the flex circuit 34, but does not directly contact the flex circuit. As will be discussed in detail below, a gap is maintained between the battery surface and the surface of the flex circuit opposite the microphone. In this embodiment, the gap is maintained by battery spacer 62.

Figure 5:
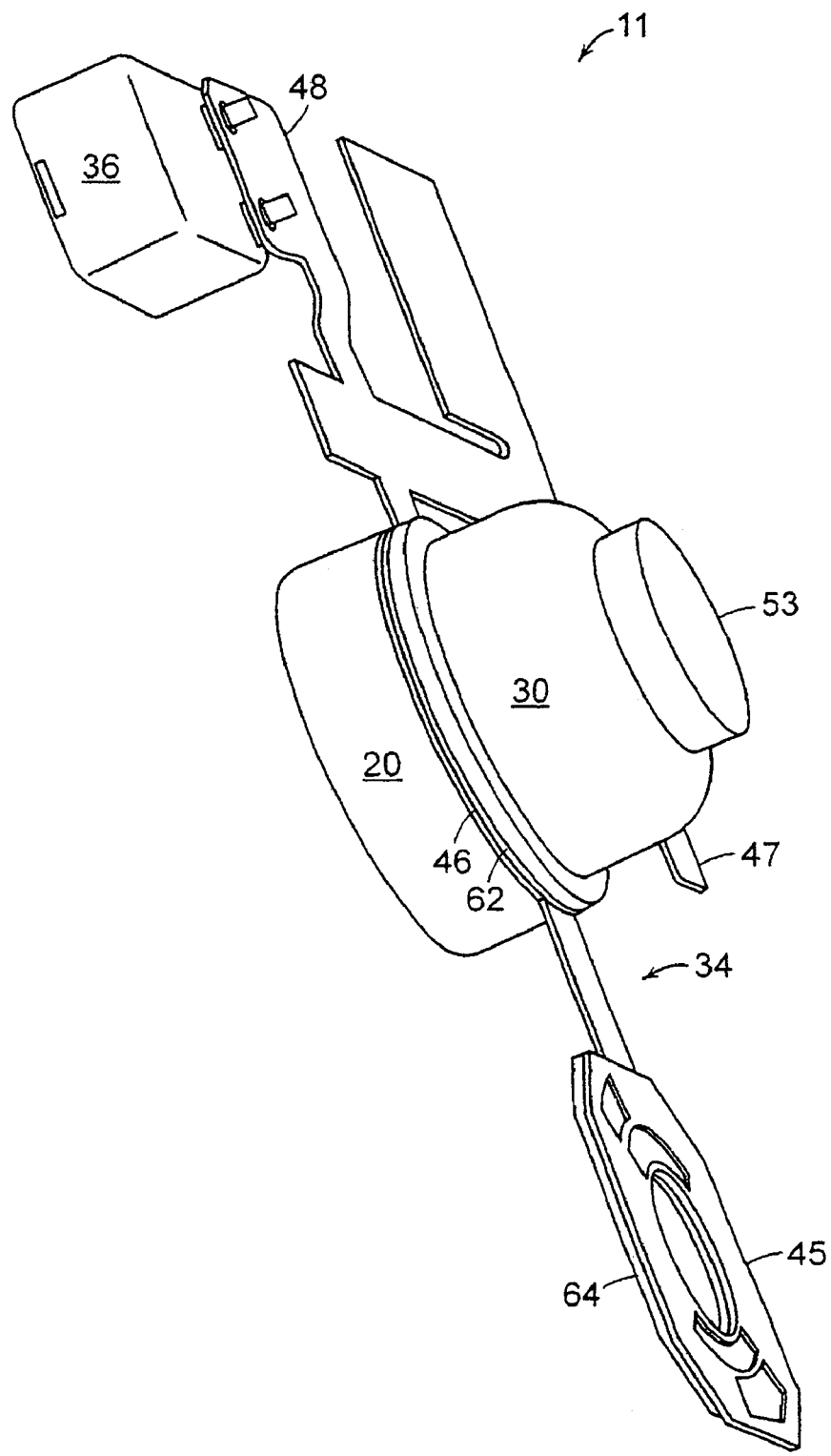
FIG. 5 shows partially assembled hearing aid electronics assembly.

FIG. 5 shows the flex circuit 34 with the microphone 20, battery 30 and receiver 36 mounted to the circuit. The microphone 20 is mounted directly to a first surface of the flex circuit 34. The microphone 20 is electrically coupled to the circuit such that the electrical signals produced by the microphone in response to external audio inputs can be processed by the circuitry on the flex circuit to provide a desired frequency response. The processed signal is then sent via electrical connections in the flex circuit to the receiver 36, which is mounted on the flex circuit at the receiver mounting portion 48 of the circuit. The battery 30 is mounted on the underside of the flex circuit, and is spaced from the flex circuit by battery spacer 62. A stiffener plate 64 can be mounted on the flex circuit at the switch trace portion 45 of the flex circuit.

Figure 6:
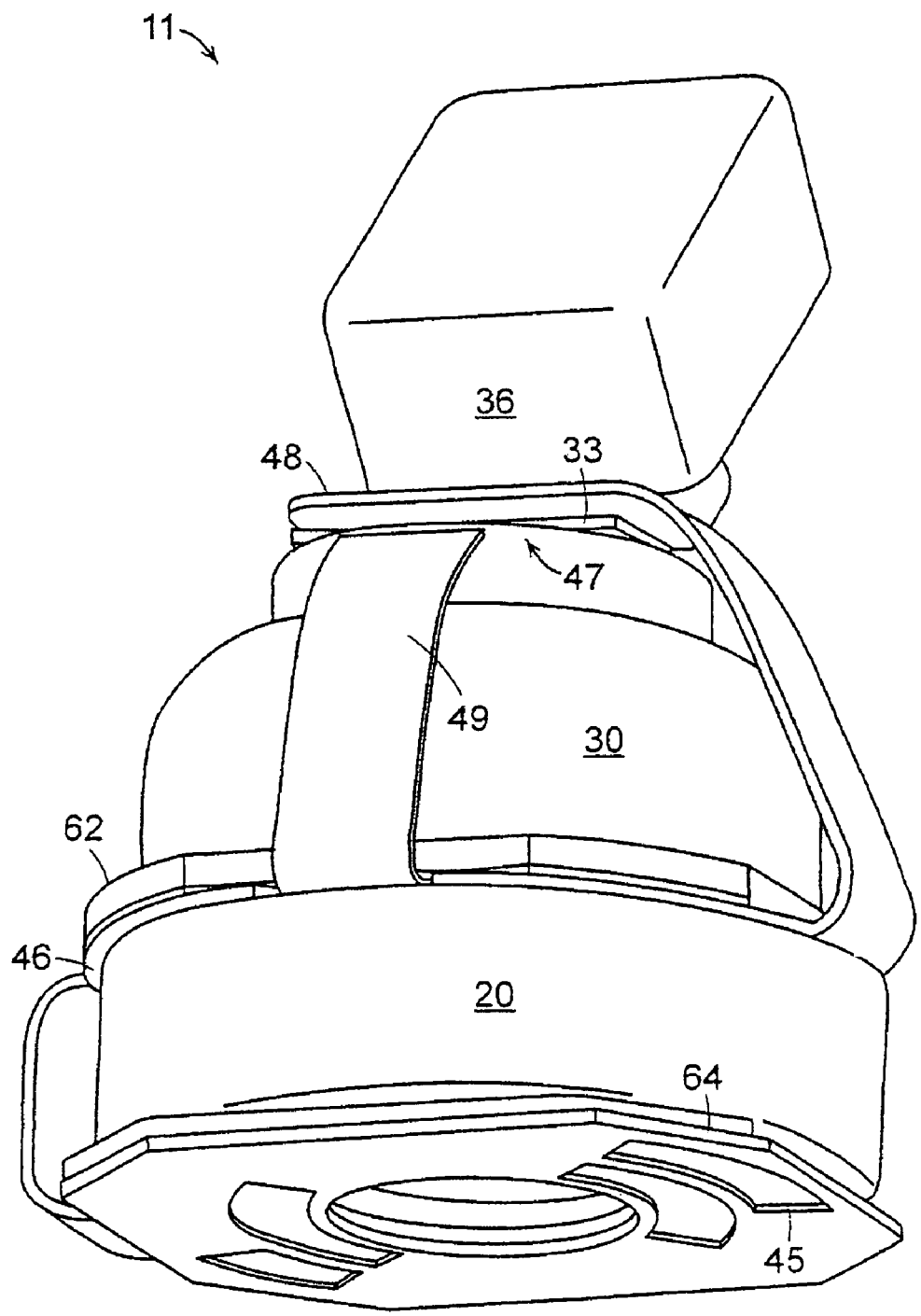
FIG. 6 shows a fully assembled hearing aid electronics assembly.

FIG. 6 illustrates the fully assembled hearing aid electronics module 11. As shown in this figure, the switch trace portion 45 of the circuit is folded over the front surface of the microphone 20. The battery contacts 47, 49 are folded over and brought into electrical contact with the positive and negative terminals of the battery 30. The battery contacts 47, 49 of the flex circuit can be substantially permanently attached to the battery 30 using solder or a conductive epoxy. The contacts could also be welded to the battery. (In this embodiment, the hearing aid is a disposable hearing aid, since the substantially permanently attached battery 30 is not intended to be replaced. Once the battery is discharged, the hearing aid can be disposed of and replaced with a new hearing aid. Alternatively, the battery could be a rechargeable battery, and the battery can be recharged.) The receiver mounting portion 48 is folded over so that the receiver 36 is located adjacent to the anode 33 of the battery 30. The fully assembled hearing aid electronics module 11 is a relatively small and compact assembly, which helps reduce the overall size of the hearing aid. The electronics module 11 can be pre-assembled, and a plurality of these modules can be mass-produced, prior to the full assembly of the hearing aid devices.

Switching Mechanism

Figure 7A:
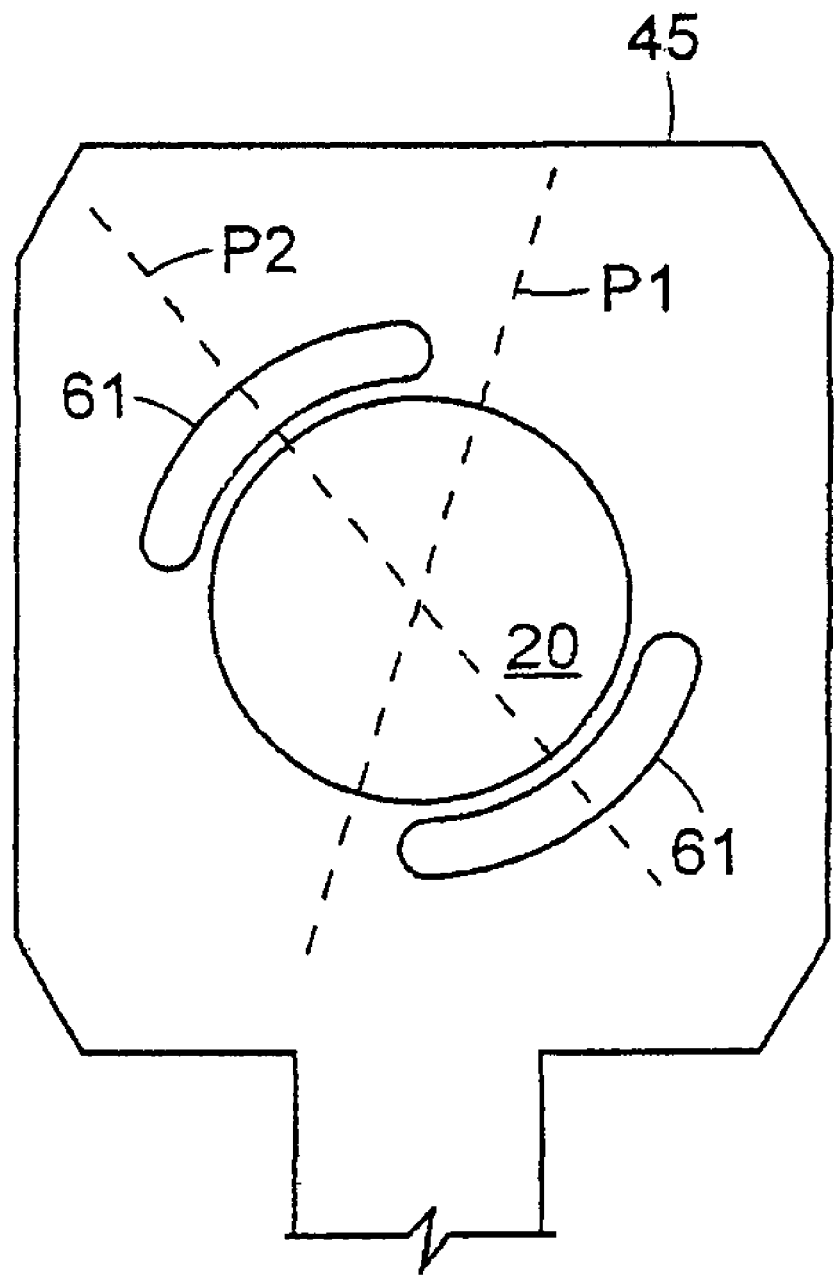
FIGS. 7A and 7B shows a hearing aid circuit board having switch traces.

Turning now to one aspect of the invention, in certain embodiments the hearing aid circuit board comprises at least one switch trace thereon, and the hearing aid comprises a switching mechanism to allow a user to turn the hearing aid on or off, and/or to modify the volume of the hearing aid, and/or to otherwise effect the hearing aid's performance. FIG. 7A shows the switch trace portion 45 of the hearing aid flex circuit 34 according to one embodiment of the invention. In this embodiment, a pair of switch traces 61 are integrated with the hearing aid circuit board 34 to form an ON/OFF switch for the hearing aid. As shown in FIG. 7A, the switch trace portion 45 of the circuit is mounted to the face of microphone 20, and includes a central opening to permit sound waves to reach the microphone. Surrounding this opening is a set of switch traces 61, made from an electrically conductive material that is preferably printed on the circuit. The pair of switch traces 61 are electrically connected to the hearing aid battery 30 such that they represent a discontinuity between the battery 30 and at least one component of the hearing aid, such that unless the discontinuity is bridged, the hearing aid 10 or a component thereof does not draw power from the battery 30. Placement of a conductor material across the pair of switch traces 61 allows power to flow uninterrupted through the hearing aid components. As illustrated in FIG. 7A, when a conductive material is placed in position P1, the discontinuity across the set of switch traces 61 is not bridged, and the hearing aid, or at least one or more components of the hearing aid, does not draw any power. The hearing aid can thus be considered in the "OFF" state when the conductive material is in position P1. However, when a conductive material is placed in position P2, the discontinuity is bridged between the respective traces comprising trace pair 61. The hearing aid draws power across trace pair 71, and is now considered in the "ON" state. It will be understood that the pair of switch traces 61 could be located in any practical location on the circuit board. For example, they could be adjacent to one another on one side of the sound hole for microphone 20 (as is shown in FIG. 7B, below).

Figure 7B:
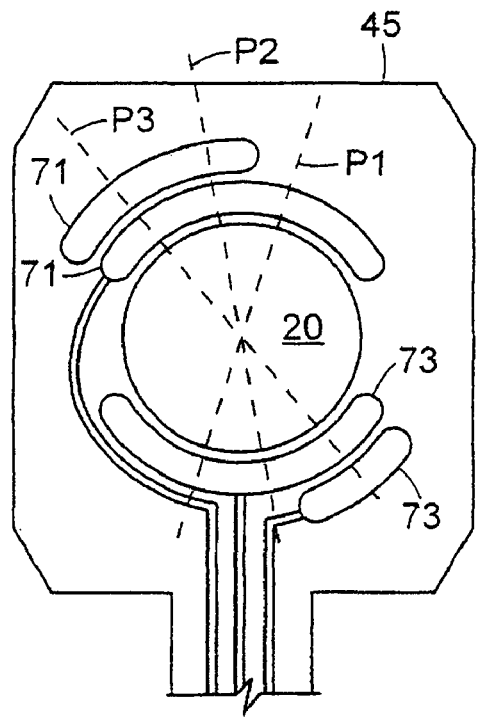

In the embodiment shown in FIG. 7B, two pairs of switch traces 71, 73 are provided on the switch trace portion 45 of the flex circuit, and configured to provide both an "ON/OFF" switch, as well as a volume-control function for the hearing aid. In this embodiment, switch trace pair 71 comprises the "ON/OFF" switch, and the traces are located adjacent to one another on a first side of the microphone sound hole. (A second pair of switch traces 73 is located on the opposite side of the sound hole). When a conductive material is placed in position P1, the discontinuity across the switch traces 71 is not bridged, and the hearing aid can thus be considered in the "OFF" state. However, when a conductive material is placed in position P2, the discontinuity is bridged between the respective traces comprising trace pair 71. The hearing aid draws power across trace pair 71, and is now considered in the "ON" state.

FIG. 7B also illustrates an example of a volume control mechanism for a hearing aid. In this embodiment, when a conductive material is placed in position P2, the electrical resistance of trace pair 71 determines the amount of power drawn, and this can be used to control the volume of receiver 36. For example, when the conductive material is in position P2, the hearing aid is "ON," at "LOW" volume. When the conductive material is placed in position P3, the conductive material bridges both trace pairs 71 and 73. The resistance across the traces is now altered (for example, bridging the second set of traces can short out a volume-limiting resistor), and the hearing aid is now "ON" at "HIGH" volume. Various modifications to this basic volume control mechanism will be readily understood. In general, the switch traces on the circuit board are configured such that the physical position of a switch contact across the traces determines two or more resistance values across the traces, where the respective resistance values across the traces control the volume of the hearing aid.

As shown herein, the switch traces are preferably in the form of arcs, though they could be straight or have any useful configuration. In one embodiment, the trace width is at least about 0.1 mm. In yet another embodiment, the trace width is at least about 0.3 mm. In yet another embodiment, the trace width is at least about 0.5 mm. In another embodiment, the trace width is less than about 5 mm. In yet another embodiment, the trace width is less than about 3 mm. In yet another embodiment, the trace width is less than about 2 mm. Each trace is generally between about 0.1 and 5 mm in width, and preferably have a spacing between adjacent traces of between about 0.5 and 2 mm. In one embodiment, the spacing between adjacent tracings is at least about 0.5 mm. In yet another embodiment, the spacing between adjacent traces is at least about 0.8 mm. In another embodiment, the spacing between adjacent traces is less than about 2 mm. In yet another embodiment, the spacing between adjacent traces is less than about 1.5 mm. Where the switch traces are in the form of arcs, they generally have a radius of from about 1 mm to about 6 mm, and preferably from about 2 mm to about 5 mm. The switch traces can comprise copper, for example. The switch traces can also be plated with other metals. In one embodiment, the switch traces comprise copper that is nickel plated, and then further plated with gold. The nickel prevents the gold and copper from diffusing into each other, and the gold plating provides a reliable switch contact surface.

Although the embodiment shown here comprises two pairs of switch traces, it will be understood that the switching mechanism could comprise a single pair of switch traces, or just one switch trace, such that the hearing aid, or a component of the hearing aid, draws no power until a conductor material is placed in contact with at least one switch trace. It will be understood that more than two pairs of switch traces could also be employed.

Figure 8:
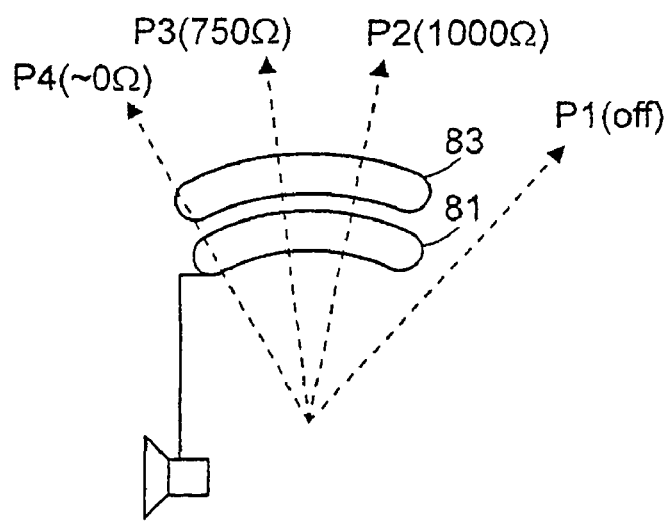
FIG. 8 shows a hearing aid circuit board having a variable resistor switch trace.

It will be understood that various modifications to this basic switch trace scheme can be employed to provide varying levels of resistance, and thus varying hearing aid performance states. For example, as shown in FIG. 8, an alternative configuration of switch traces is shown, in which there is only a single pair of switch traces 81, 83. In this embodiment, one of the traces 81 comprises a variable resistor. Thus, as the conductive bridge material is moved from position P1 ("OFF"), to P2, P3 and P4, the electrical resistance across the traces is altered (from 1000Ω to 750Ω to ~0Ω, respectively). The trace 81 is electrically connected to receiver 36, thus providing essentially continuous volume control for the receiver across a particular dynamic range. It will be understood that the maximum resistance across the traces may be higher or lower than 1000Ω, and the resistance may be made to vary linearly or non-linearly with the physical position of a switch contact. In general, the maximum resistance value across the traces is from about 1000 to 10,000Ω, with a preferred maximum value of about 2000 to 4000Ω. It will also be understood that the resistance across the switch traces need not be in series with the receiver, but could instead by connected to the signal processing circuitry in order to accomplish a volume control function, or another function such as a tone control function. If the resistance is connected to the signal processing circuitry, the maximum resistance value can be even higher, such as 100 kΩ, or even 1 MΩ.

Figure 9:
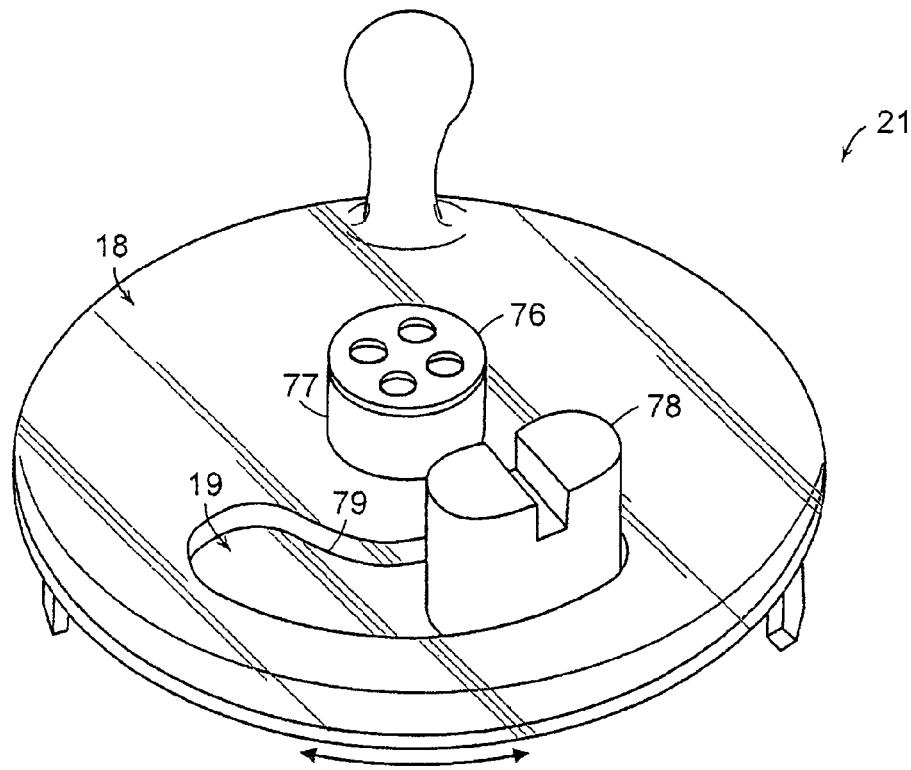
FIG. 9 is a front view of a hearing aid face plate with switching mechanism.
Figure 10:
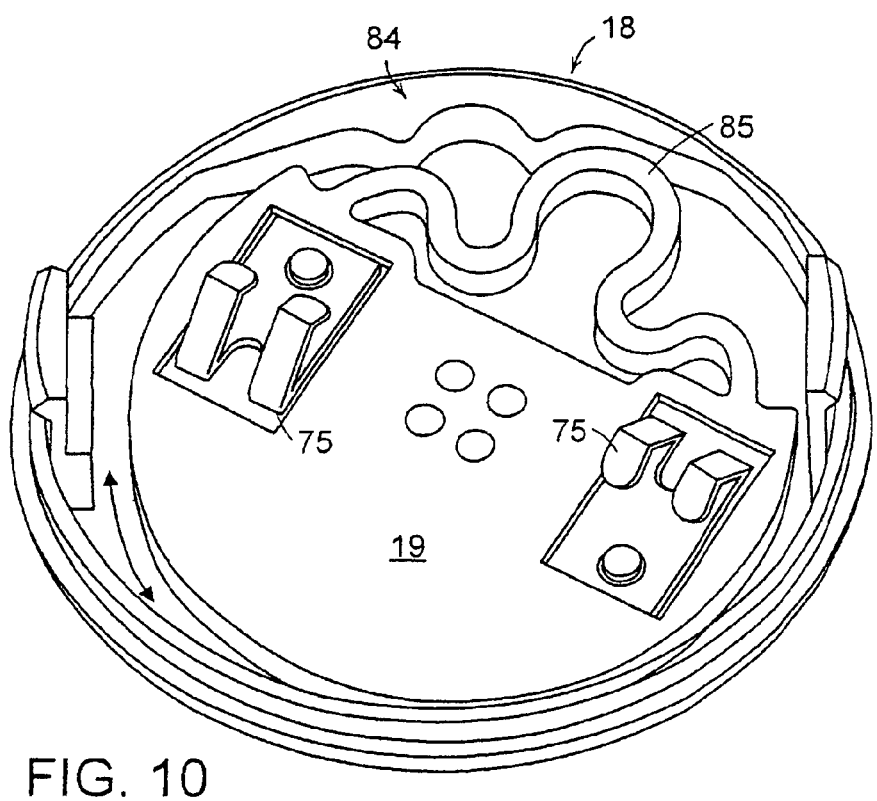
FIG. 10 is a rear view of a hearing aid face plate with switching mechanism.

An exemplary embodiment of a switching mechanism 21 according to the invention is shown in FIGS. 9 and 10. FIG. 9 is a front perspective view of the face plate 18 and rotary switch 19 of the hearing aid. FIG. 10 is a rear perspective view of the face plate 18 and rotary switch 19. As previously discussed, the rotary switch 19 is located directly behind the face plate 18 in the hearing aid. As shown in FIG. 10, the rotary switch 19 generally has a smaller diameter than the face plate 18, and can rotate in a plane (in the direction indicated by arrow) relative to the face plate. The rotary switch may have a hollow shaft 76 and a raised tab 78 that extend out of the plane of rotation of the rotary switch 19. The hollow shaft 76 is located substantially at the axis of rotation of the rotary switch 19, and the raised tab 78 is radially offset from the shaft 76. The hollow shaft 76 can comprise one or more holes extending therethrough to permit air and sound waves to enter the hearing aid. The face plate 18 contains a pair of openings 77, 79, including a central circular opening 77 through which the hollow shaft 76 extends, and an arc-shaped slot 79 through which the raised tab 78 extends. The rotary switch 19 is thus rotatable with respect to the face plate 18 over a limited angular range by moving the raised tab 78 within the arc-shaped slot 79. In general, the radius of rotation of the raised tab 78 is between about 2.5 mm and about 5.0 mm, and the arc of rotation of the tab is less than about 100 degrees, and generally between about 20 degrees and 70 degrees. In one embodiment, the radius of rotation of the raised tab 78 is at least about 2.5 mm. In yet another embodiment, the radius of rotation of the raised tab 78 is at least about 3 mm. In another embodiment, the radius of rotation of the raised tab 78 is less than about 5 mm. In yet another embodiment, the radius of rotation of the raised tab 78 is less than about 4 mm. In one embodiment, the arc of rotation of the tab is less than about 80 degrees. In yet another embodiment, the arc of rotation of the tab is less than about 70 degrees. In another embodiment, the arc of rotation of the tab is at least about 20 degrees. In yet another embodiment, the arc of rotation of the tab is at least about 40 degrees.

While not wishing to be bound by theory, it is believed that the rotary switch of the present invention is easy to operate, even for those with impaired dexterity, because the movement from one switch location to the next approximates a straight-line movement. Preferably, a switch segment, that is the rotation from one position to the next position, should not be greater than about 50 degrees. More preferably, a switch segment is not greater than about 40 degrees. Even more preferably, a switch segment is not greater than about 35 degrees. On the other hand, a switch segment movement should be sufficient that the user realizes that movement has occurred. Preferably, a switch segment should be at least about 5 degrees; more preferably, at least about 7 degrees; and even more preferably, at least about 8 degrees.

On the bottom surface of the rotary switch 19 are one or more rotating electrical contacts 75. These contacts are configured to selectively engage with the switch traces on the hearing aid circuit to serve as the conductive "bridge" across the switch traces, as described in detail above. Thus, by moving the raised tab 78 the protrudes through the face plate of the hearing aid, the user is able to selectively bring the rotating electrical contacts into and out of engagement with the one or more switch traces on the hearing aid circuit. In general, the user is able to at least switch the hearing aid between and "OFF" state and an "ON" state, and is typically also able to move the switch to control the volume of the hearing aid, in the manner described above in connection with FIGS. 7A, 7B and 8. In the embodiment shown in FIGS. 9 and 10, for example, the user can move the switch into one of three positions, corresponding to three different operating states for the hearing aid: "OFF," "Low Volume," and "High Volume." The rotating electrical contacts 75 of FIG. 10 can be rotated to bridge pairs of adjacent switch traces on the circuit board, such as shown in FIG. 7B, for example.

Generally, the switch mechanism 21 includes tactile means to permit the user to easily determine the position of the raised tab 78 within slot 79, and thus the position or operating state of the electrical contacts 75 with the switch traces 71, 73. The switch mechanism preferably also includes means for maintaining the switch in a desired operating state until changed by the user. For example, in FIG. 10, the face plate 19 contains a pattern of notches 84 along its inner circumference that mate with a detent 85 on the rotary switch 19 over a series of discrete switch locations corresponding to discrete operating states of the hearing aid. As the user moves the switch to different positions, the movement of the detent 85 to an adjacent notch 84 enables the user to know that the operating state of the device has changed. Alternatively, a similar series of notches could be provided on the arc-shaped slot 79 of the face plate 18. Also, visual means could be provided to enable the user to determine the position of the switch, such as markings on the face plate or rotary switch, or a color-coded pattern on the rotary switch that is visible as the user rotates the raised tab to various positions.

An advantage of the rotary switching mechanism is that the switch provides the added functionality of an ON/OFF switch and/or volume control for a hearing aid while adding essentially no additional bulk to the hearing aid, since virtually the entire switching mechanism operates in the plane of the hearing aid face plate. Moreover, the rotary switch is very easy to use, since the raised tab rotates over a relatively limited arc, and thus approximates the operation of a linear switch.

Figure 14A:
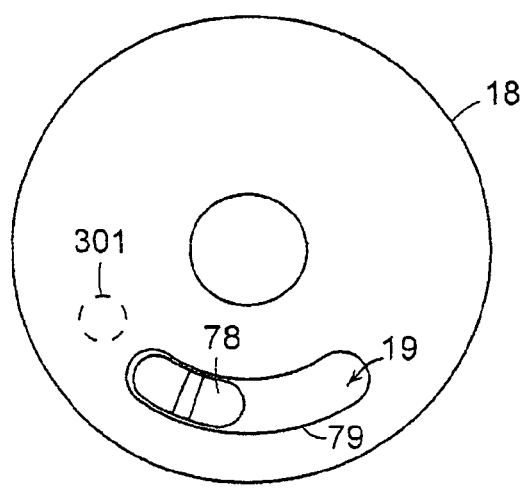
FIGS. 14A and 14B show a hearing aid face plate and a rotary switch having an air passageway through the switch.
Figure 14B:
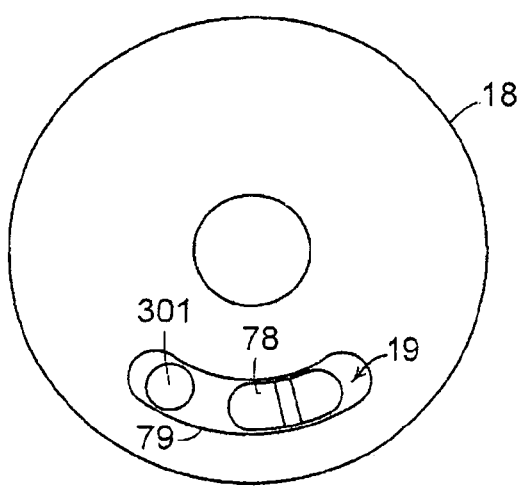

In yet another embodiment, the rotary switch 19 can be employed to control air flow to the interior of the hearing aid, including air flow to the hearing aid battery. This is illustrated in FIGS. 14A and 14B, which depict a front view of the hearing aid face plate 18 with rotary switch 19. As shown in FIG. 14A, the raised tab 78 of the rotary switch 19 is at a first switch position within arc-shaped slot 79. An air hole 301 (shown in phantom) is provided through the rotary switch 19. In this switch position, the air hole 301 is covered by the face plate 18, and thus ambient air cannot enter the hearing aid through air hole 301. A sealing mechanism between the air hole 301 on the rotary switch 19 and the interior surface of the face plate 18 can be employed to further restrict air from entering the hearing aid. In FIG. 14B, the raised tab 78 is moved to a second switch position, which exposes the air hole 301 to ambient air. Air can thus enter the hearing aid through air hole 301. Preferably, air is not permitted to enter through air hole 301 when rotary switch 19 is in a power off position. Air hole 301 can comprise an air passageway to the hearing aid battery, a sound passageway to the hearing aid microphone, or both. Air hole 301 can comprise the primary means for air and/or sound to enter hearing aid, or it can supplement additional openings for air and sound.

Figure 15A:
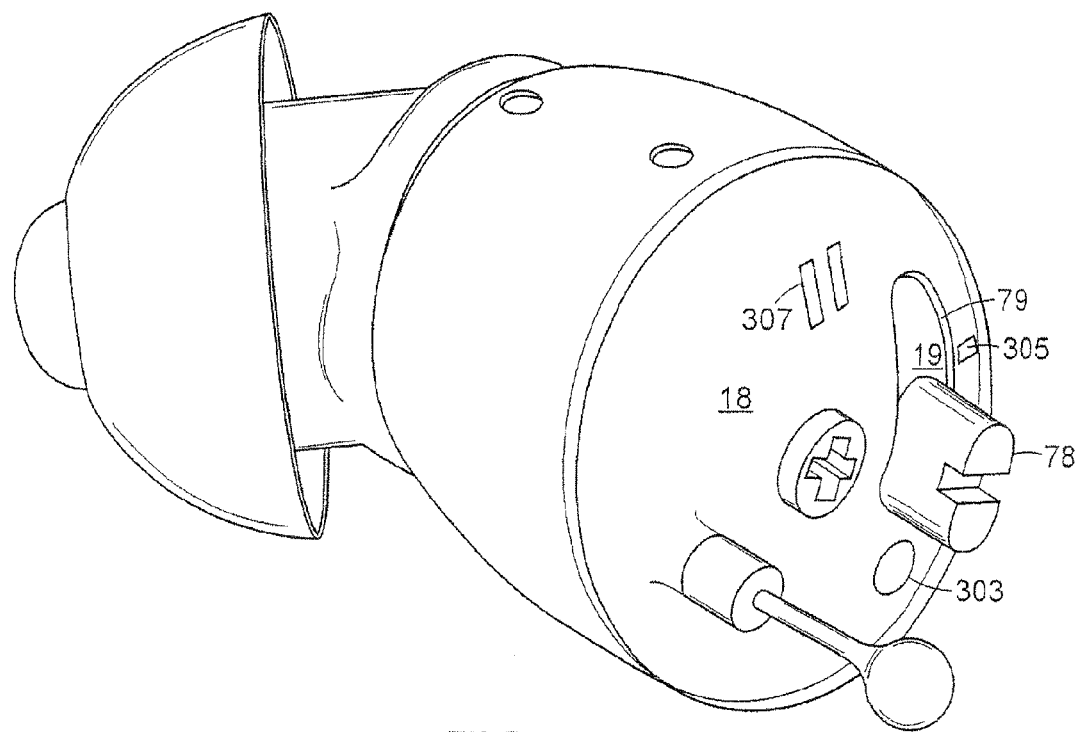
FIGS. 15A, 15B and 15C show an alternative design for a hearing aid having a rotary switch in three different switch positions.
Figure 15B:
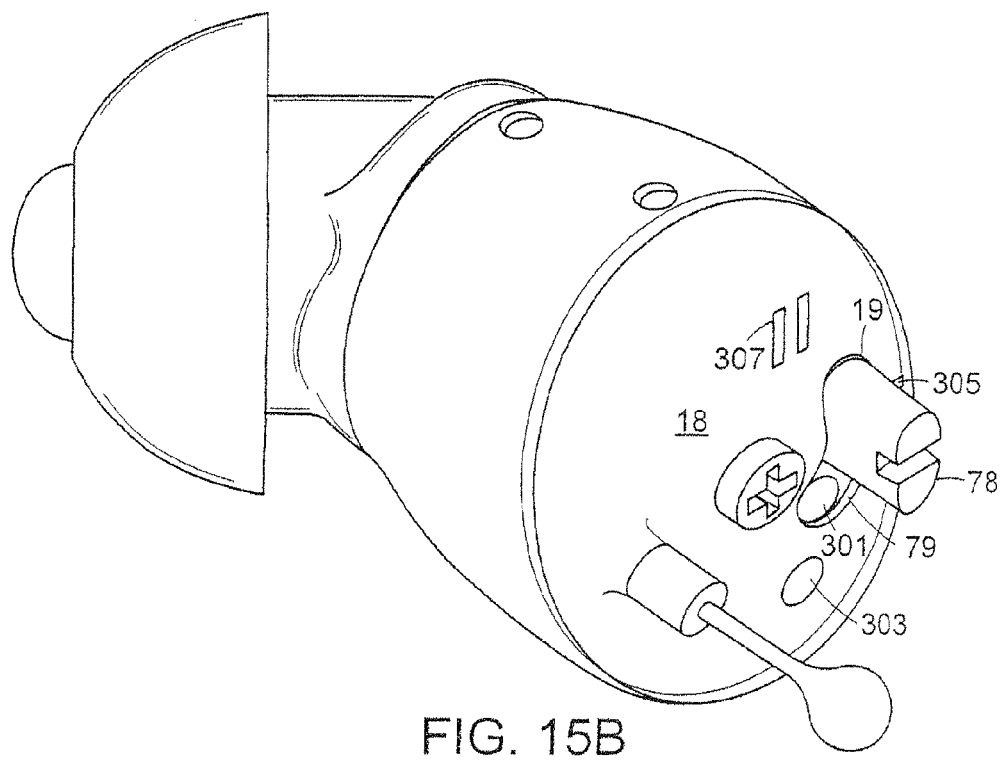
Figure 15C:
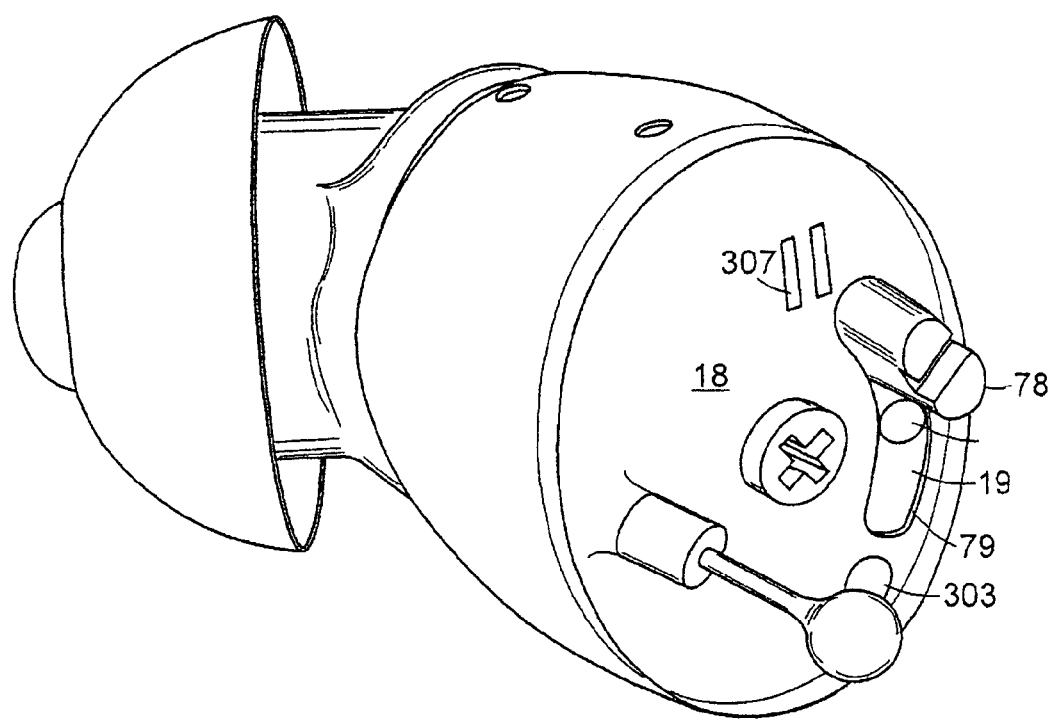

A hearing aid having a switching mechanism and a selectively-sealable air hole 301 is illustrated in FIGS. 15A, 15B and 15C. These figures depict a hearing aid that is similar to the hearing aid of FIG. 1. In FIG. 15A, the user-operable tab 78 of the switching mechanism is shown in a first switch state. This corresponds to the "OFF" operating state of the hearing aid. The air hole 301 through the rotary switch 19 is not visible in this switch position. In FIG. 15B, the tab 78 is shown in a second switch state, which corresponds to the "LOW volume" operating state of the hearing aid. Note that with the movement of the tab 78 from the first (OFF) state to the second (LOW volume) state, the air hole 301 of the rotary switch 19 is now rotated into alignment with the arc-shaped slot 79 of the face plate 18, and is exposed to ambient air. Finally, FIG. 15C depicts the tab 78 in a third switch state, which corresponds to the "HIGH volume" operating state of the hearing aid. The air hole 301 through the rotary switch 19 remains exposed through the arc-shaped slot 79 of the face plate 18 in this switch state. It should also be noted that FIGS. 15A-15C illustrate one example of visual indicators 303, 305, 307 on the hearing aid which help the user determine the switch position and operating state of the hearing aid. Indicator 303, which in this example is a solid dot, indicates that the hearing aid is OFF. Indicator 305, which comprises a single bar, indicates that the hearing aid is on LOW volume. Indicator 307, which comprises a pair of bars, indicates that the hearing aid is on HIGH volume. These indicators can be color-coded to further help differentiate the operating states. For example, the "OFF" indicator can be red, while the "ON" indicator(s) can be green.

Battery/Circuit Gap and Air Flow Restriction

Figure 11:
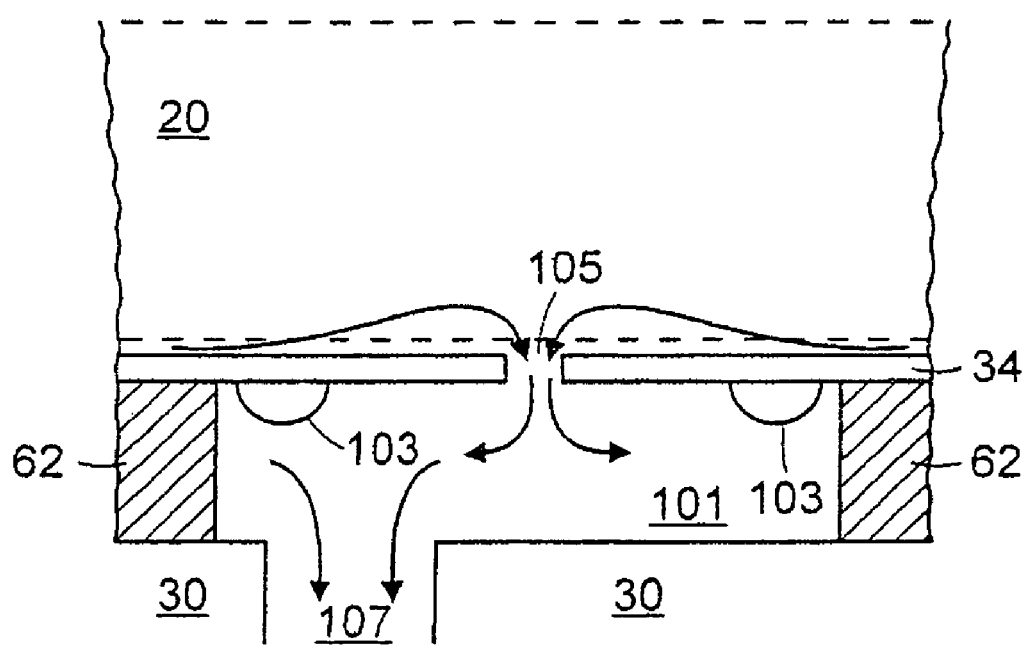
FIG. 11 shows a hearing aid battery spaced apart from a circuit board and forming an enclosure.

Turning now to FIG. 11, the interface of the hearing aid battery 30 and the hearing aid circuit 34 is shown in cross-section. As discussed previously, in one aspect of the invention, the hearing aid battery 30 is mounted behind the microphone mating portion 46 of the flex circuit 34, opposite the microphone 20 (shown in phantom). The surface of the battery 30 generally extends adjacent and parallel to the flex circuit 34, but does not contact the flex circuit at this interface. In certain embodiments of the invention, a gap 101 is formed and maintained between the battery surface and the opposing surface of the flex circuit. One significant advantage of maintaining this gap is that the risk of a short circuit forming between the battery and a conductive element of the flex circuit, such as solder bumps 103 (or any other electrical components) extending from the underside of the circuit, is greatly minimized.

The gap 101 between the battery and the flex circuit can be formed and maintained using any desired means. In the embodiments illustrated here, the gap 101 is maintained by battery spacer 62, as was previously described in connection with FIGS. 4-6. The spacer is preferably made from an electrically insulating material to prevent short circuiting between the battery and the flex circuit. In yet another embodiment, the spacer may have at least one electrically conductive portion that may be used to establish an electrical connection between the battery and the circuit board.

In certain embodiments, the hearing aid battery 30 comprises an air-activated power source, such as a metal-air (e.g. zinc-air) battery. These batteries use oxygen as a reactant. As such, the hearing aid must be designed so that a sufficient quantity of air reaches the air access hole(s) on the cathode side of the battery. It would be desirable to control the flow of air (or any similar battery reactant) to the battery in order to minimize the impact of environmental conditions on the performance of the battery (e.g., to prevent the battery from drying out or flooding).

In yet another aspect of the present invention, the hearing aid circuit 34 forms a substantially air-tight seal with at least one portion of the battery 30 in order to control air flow to the battery. Preferably, the circuit 34 and the battery 30 form a substantially enclosed chamber therebetween, where the chamber comprises a vent 105 to control the flow of a reactant (e.g. air) to the battery. In one embodiment, the chamber has an interior volume of at least about 0.01 mm$^3$. In yet another embodiment, the chamber has an interior volume of at least about 0.05 mm$^3$. In yet another embodiment, the chamber has an interior volume of at least about 0.1 mm$^3$. In yet another embodiment, the chamber has an interior volume of at least about 0.15 mm$^3$. In yet another embodiment, the chamber has an interior volume of at least about 0.2 mm$^3$. In yet another embodiment, the chamber has an interior volume of at least about 0.25 mm$^3$. In another embodiment, the chamber has an interior volume of less than about 25 mm$^3$. In yet another embodiment, the chamber has an interior volume of less than about 100 mm$^3$. In yet another embodiment, the chamber has an interior volume of less than about 200 mm$^3$. In yet another embodiment, the chamber has an interior volume of less than about 300 mm$^3$. In another embodiment, the chamber has an interior volume of less than about 400 mm$^3$. In another embodiment, the chamber has an interior volume of less than about 450 mm$^3$. Preferably, the chamber has an interior volume from about 0.25 mm$^3$ to about 25 mm$^3$, and generally from about 0.15 mm$^3$ to about 450 mm$^3$.

The vent 105 can be a hole through the circuit board, as shown in FIG. 11. In one embodiment, the vent has a cross-section area of at least about 3×10$^{-4}$ mm$^2$. In yet another embodiment, the vent has a cross-section area of at least about 6×10$^{-4}$ mm$^2$. In yet another embodiment, the vent has a cross-section area of at least about 8×10$^{-4}$ mm$^2$. In yet another embodiment, the vent has a cross-section area of at least about 1×10$^{-3}$ mm$^2$. In another embodiment, the vent has a cross-section area of less than about 2×10$^{-1}$ mm$^2$. In yet another embodiment, the vent has a cross-section area of less than about 1.5×10$^{-1}$ mm$^2$. In yet another embodiment, the vent has a cross-section area of less than about 1×10$^{-1}$ mm$^2$. In yet another embodiment, the vent has a cross-section area of less than about 5×10$^{-2}$ mm$^2$. In yet another embodiment, the vent has a cross-section area of less than about 1×10$^{-2}$ mm$^2$. Generally, the vent hole 105 has a cross-section area of from about 3×10$^{-4}$ mm$^2$ to about 2×10$^{-1}$ mm$^2$, and preferably from about 1×10$^{-3}$ mm$^2$ to about 1×10$^{-2}$ mm$^2$. The vent hole 105 can be provided during manufacture of the circuit, and can by formed by a laser, a chemical etch process, mechanical drilling, or any suitable means. The vent hole may be round, multi-sided, symmetrical, non-symmetrical, regular, irregular or any suitable shape.

As illustrated in FIG. 11 (and also shown in FIGS. 4-6), a spacer 62 can be provided between the surface of the battery 30 and the surface of the circuit board 34. The spacer 62 includes an opening extending through the surface of the spacer, and forms part of the substantially enclosed chamber. The surface of the battery comprises at least one air intake hole 107 that is at least partially open to the chamber. In general, the cross-sectional area of the vent hole 105 through the circuit is substantially less than the cross-sectional area of the air intake hole 107 in the battery. The effect of this is that the vent hole in the circuit board acts as an air flow restrictor, restricting the flow of air into the battery cathode. At the same time, the cross-sectional area of the opening in the spacer 62 is generally substantially greater than the cross-sectional areas of both the vent hole in the circuit and the air intake hole in the battery, so that the vent hole 105 does not need to be closely aligned and registered with the battery's intake hole 107.

This is more clearly illustrated in the air flow patterns shown in FIG. 11. As can be seen in the figure, ambient air is present in the gap between the hearing aid circuit board 34 and the microphone 20 (since the interface between these components is generally not air-tight). A small amount of this air enters the chamber between the circuit and the battery through the small vent hole 105 in the circuit board. Significantly, the flow of air into this chamber can be controlled by selecting an appropriate size for the vent hole in the circuit board. Once the air enters the chamber, the chamber acts as an air reservoir for the battery cathode. The size of this reservoir can be controlled by selecting an appropriate volume for the chamber. This volume can be selected to optimize the performance of the air-activated battery. Notably, in this embodiment, the vent hole 105 and the air intake hole 107 of the battery are not aligned with one another, but because both are open to the chamber, the air can still reach the battery through the relatively small vent hole 105. This is significant, since the location of the air intake holes in metal-air batteries is not a standardized feature and can vary between manufacturers and models. Using the present invention, however, the circuit board with a vent hole 105 can still provide air to different types of metal air batteries, since precise alignment of the holes is not required. The fact that the vent hole 105 acts as an air flow restrictor is an important factor for improving hearing aid performance, since the restricted air flow to the battery minimizes the risk of premature drying of the battery, excessive current draw, and other problems.

It will be further understood that although vent 105 is shown as an opening through the circuit board 34, the venting of the chamber 101 could also be accomplished by providing a vent through the spacer 62. The vent could comprise, for example, a hole through the spacer, or a groove or slot on a surface of the spacer that allows air from the hearing aid housing to enter the substantially enclosed chamber 101. The spacer itself could be made from an air permeable material in order to provide a controlled air flow to the battery.

It will be understood that the battery spacer 62 is not required for the invention, and at least a portion of the battery may be brought into direct sealing engagement with at least a portion of the flex circuit, though this may require closer alignment between the vent hole 105 and the air intake hole 107 of the battery. For example, in certain embodiments, the battery can include a depressed surface, so that a relatively sizeable chamber is formed between the depressed surface of the battery and the (generally flat) surface of the circuit board.

Sealed Microphone Cavity

Figure 12:
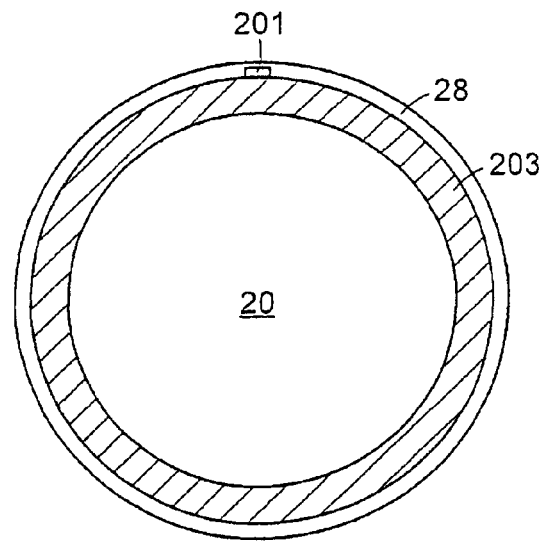
FIG. 12 is a cross-sectional front-view of a hearing aid microphone with sealing gasket.
Figure 13:
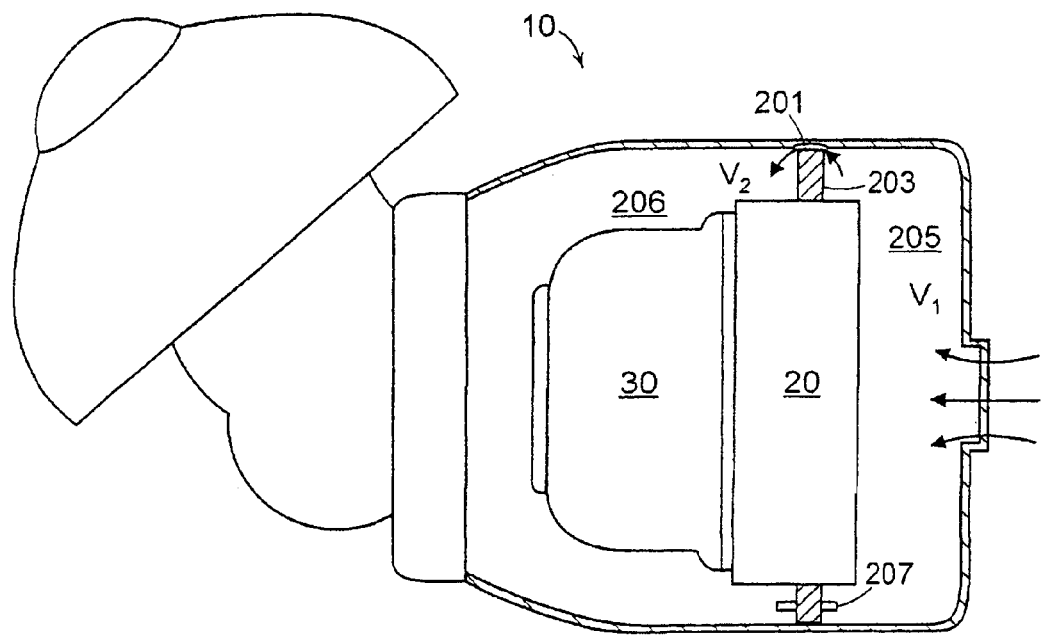
FIG. 13 is a side cross-sectional view of the hearing aid microphone of FIG. 12.

Turning now to FIGS. 12 and 13, yet another aspect of the invention is illustrated. FIG. 12 shows a cross-section of a hearing aid according to one embodiment of the invention. As shown in this figure, the hearing aid microphone 20 is located within the hearing aid shell 28. A sealing member 203, such as a gasket or o-ring, concentrically surrounds the periphery of the microphone 20, and substantially completely fills the area of the hearing aid between the outer periphery of the microphone and the interior surface of the hearing aid shell 28. The sealing member 203 surrounding the microphone 20 is shown in the side view of FIG. 13. An air vent 201 is provided to allow air to pass behind the sealing member 203 to the interior portion 206 of the hearing aid housing, which includes the battery 30. In the embodiment illustrated in FIG. 12, the air vent 201 comprises a slot that is molded into the interior of the hearing aid shell 28. In this embodiment, the slot is about 8-mils wide and about 12-mils deep. Other shapes and sizes for the vent could also be used. In addition, multiple vents could be employed. The vent could also comprise a passageway through the sealing member 203. For example, as shown in FIG. 13, a hollow tube 207 (such as a hypodermic needle) could be inserted through the sealing member 203 to provide a vent passageway. In addition, the sealing member 203 itself could comprise an air-permeable material to provide the venting of air to the interior of the hearing aid.

Preferably, the sealing member and vent arrangement provide an acoustic seal, so that audible sound waves are substantially prevented from entering the interior portion 206 of the hearing aid housing, while a sufficient quantity of air is able to pass through the air vent 201 to provide the necessary oxygen for the battery. In essence, the air vent is configured to provide a relatively high-impedance to audio frequency sound waves, but a relatively low impedance to the diffusion of oxygen to the battery. Said another way, the vent represents a low impedance to very low frequency signals including dc (direct current). The sealing member and vent arrangement are thus air permeable, but substantially impermeable to sound waves in the audible frequencies.

An advantage of this design is that the acoustical sealing provided by the sealing member 203 eliminates the interior portion 206 of the hearing aid shell as a resonance volume that could distort the audio signal received at the microphone. In addition, the presence of the sealing member 203 surrounding the microphone further reduces the volume of the resonant cavity 205 in front of the microphone 20. This has the effect of raising the resonant frequency of the cavity, and amplifying the high-frequency sound waves before they are received at the microphone. The geometry of the cavity in front of the microphone can be tuned to affect hearing aid audio performance, as is further described in co-pending U.S. patent application Ser. No. 11/343,906, filed Jan. 30, 2006, entitled "Hearing Aid with Tuned Cavity," the entire teachings of which are incorporated herein by reference. In addition, the vent hole 201 acts as an air flow restrictor to the battery, similar to the vent in the circuit board described in connection with FIG. 11 above, and thus reduces the risk of premature drying of the battery, excessive current draw, and other problems.

While this invention has been particularly shown and described with references to preferred embodiments thereof, it will be understood by those skilled in the art that various changes in form and details may be made therein without departing from the scope of the invention encompassed by the appended claims.

What is claimed is:

1. A hearing aid comprising:
   a microphone;
   a metal-air battery;
   a hearing aid shell having a faceplate; and
   a rotary switch having a rotating member that is adjacent to and substantially parallel with the faceplate, wherein at least one position of the rotary switch provides a sound passage to the microphone, at least one position of the rotary switch provides an air passage to the battery, and at least one position substantially seals the air passage to the battery, and further comprising at least one switch trace and at least one electrical contact for controlling a function of the hearing aid.

2. The hearing aid of claim 1, wherein the rotary switch controls at least the on/off function of the hearing aid.

3. The hearing aid of claim 1, wherein the rotary switch controls at least the volume function of the hearing aid.

4. The hearing aid of claim 1, wherein the at least one switch trace provides portions of higher electrical resistance and portions of lower electrical resistance.

5. The hearing aid of claim 1, wherein the rotary switch rotates around a shaft.

6. The hearing aid of claim 5, wherein the shaft has at least one sound passageway.

7. The hearing aid of claim 1, wherein the rotary switch has tactile means to permit the user to determine the operating position of the switch.

8. The hearing aid of claim 1, wherein the rotary switch has visual means to permit the user to determine the operating position of the switch.

9. The hearing aid of claim 1, wherein a sealing mechanism between the faceplate of the hearing aid and the rotating member of the switch substantially seals air passage to the battery.

10. The hearing aid of claim 1, further comprising a raised tab for user operation, the raised tab extending from the plane of switch rotation.

11. The hearing aid of claim 10, wherein the raised tab extends through a slot in the faceplate.

12. The hearing aid of claim 11, wherein the radial position of the tab is located and the angle of rotation is limited such that the user perceives the movement of the switch as substantially linear rather than rotational.

13. The hearing aid of claim 1, further comprising detent mechanism that mates with one or more notches on the faceplate to maintain the switch at a particular position.

14. The hearing aid of claim 1, further comprising a circuit board.

15. The hearing aid of claim 14, wherein the battery is permanently electrically connected to the circuit board.

* * * * *